(12) United States Patent
Kasai et al.

(10) Patent No.: US 11,755,209 B2
(45) Date of Patent: Sep. 12, 2023

(54) SEMICONDUCTOR MEMORY DEVICE AND ERROR DETECTION AND CORRECTION METHOD

(71) Applicant: Winbond Electronics Corp., Taichung (TW)

(72) Inventors: Takamichi Kasai, Kanagawa (JP); Fujimi Kaneko, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/673,825

(22) Filed: Feb. 17, 2022

(65) Prior Publication Data

US 2022/0291845 A1 Sep. 15, 2022

(30) Foreign Application Priority Data

Mar. 9, 2021 (JP) ................................. 2021-036890

(51) Int. Cl.
*G06F 3/06* (2006.01)
*G06F 11/10* (2006.01)

(52) U.S. Cl.
CPC .......... *G06F 3/0619* (2013.01); *G06F 3/0653* (2013.01); *G06F 3/0679* (2013.01); *G06F 11/1048* (2013.01)

(58) Field of Classification Search
None
See application file for complete search history.

(56) References Cited

U.S. PATENT DOCUMENTS

| 2009/0222708 A1* | 9/2009 | Yamaga | H03M 13/19 714/784 |
| 2011/0188303 A1 | 8/2011 | Cho et al. | |
| 2015/0254134 A1* | 9/2015 | Suzuki | G06F 11/1008 714/760 |
| 2019/0089383 A1* | 3/2019 | Funaoka | G06F 11/1048 |
| 2020/0117539 A1 | 4/2020 | Sun et al. | |

FOREIGN PATENT DOCUMENTS

| CN | 107611050 | 1/2018 |
| JP | 2000349652 | 12/2000 |
| JP | 2012123880 | 6/2012 |
| JP | 2013003656 | 1/2013 |
| JP | 2017208149 | 11/2017 |
| JP | 6744950 | 8/2020 |
| JP | 6744951 | 8/2020 |
| TW | I497495 | 8/2015 |

OTHER PUBLICATIONS

"Office Action of Japan Counterpart Application", dated Nov. 9, 2022, p. 1-p. 4.
"Office Action of Japan Counterpart Application", dated Mar. 28, 2023, p. 1-p. 3.

* cited by examiner

*Primary Examiner* — Daniel D Tsui
(74) *Attorney, Agent, or Firm* — JCIPRNET

(57) ABSTRACT

An error detection and correction method for a flash memory includes: a setting step, setting selection information to select a first error detection and correction function for performing 1-bit error detection and correction or a second error detection and correction function for performing multiple-bit error detection and correction; and an executing step, performing the first error detection and correction function or the second error detection and correction function based on the selection information during a read operation or a write operation.

12 Claims, 6 Drawing Sheets

SEMICONDUCTOR MEMORY DEVICE AND ERROR DETECTION AND CORRECTION METHOD

CROSS-REFERENCE TO RELATED APPLICATION

This application claims the priority benefit of Japan application serial no. 2021-036890, filed on Mar. 9, 2021. The entirety of the above-mentioned patent application is hereby incorporated by reference herein and made a part of this specification.

BACKGROUND

Technical Field

The present disclosure relates to a NAND flash memory as a semiconductor memory device, particularly relates to the function of switching between different error detection and correction functions.

Description of Related Art

Bit errors are caused by repeated programming or erasing of data in a NAND flash memory. An error detection and correction circuit (hereinafter referred to as an error correcting code circuit, or an ECC circuit) is configured in the flash memory as a countermeasure against such errors (see Japanese Patent No. 6744950 and Japanese Patent No. 6744951).

FIG. 1 is a schematic configuration of a conventional NAND flash memory with an on-chip ECC function. The flash memory 10 includes a memory cell array 20, a page buffer/sensing circuit 30, an ECC circuit 40, and an input-output circuit 50. The ECC circuit 40 includes a transmission circuit 42, an ECC core 44, an error register 46, and a write circuit 48.

In the read operation, the data read from the selected page of the memory cell array 20 is held in the page buffer/sensing circuit 30 to be transmitted to the ECC core 44 through the transmission circuit 42. The ECC core 44 performs an ECC operation on the transmitted data, and keeps the error information obtained by the said operation in the error register 46. The write circuit 48 writes the corrected data back to the page buffer/sensing circuit 30 based on the error information held in error register 46. In this way, after the ECC finish processing a page, the data held in the page buffer/sensing circuit 30 is read to the data bus 60 according to the column address, and the read data is provided to the input-output circuit 50. The input-output circuit 50 outputs the read data to the outside through an input/output terminal (not shown).

During the write operation, the data to be programmed input from the outside is held in the page buffer/sensing circuit 30, and the ECC core 44 generates codes (parity check bits) for transmitting data from the page buffer/sensing circuit 30. The write circuit 48 writes the generated codes to a location corresponding to a spare sector of the page buffer/sensing circuit 30. After the ECC process, the data held in the page buffer/sensing circuit 30 is programmed to the memory cell array 20.

Larger data size of a page impacts greatly on the reading or writing time or on the operating frequency of reading multiple pages continuously in synchronization with an external clock signal based on a Serial Peripheral Interface (SPI). In addition, although pipelining has a high processing speed, it also increases the wafer size. It is difficult to strike a balance between the error detection and correction capability and the reading performance.

In view of the existing problems, the disclosure provides a semiconductor memory device and an error detection and correction method in which the error detection and correction capability and the writing or reading performance coexist.

SUMMARY

The error detection and correction method of the semiconductor memory device of the disclosure includes: the setting step is to set selection information for selecting a first error detection and correction function that performs m-bit error detection and correction or a second error detection and correction function that performs n-bit error detection and correction (m and n are natural numbers, m<n); and an executing step of executing the first error detection and correction function or the second error detection and correction function based on the selection information during a read operation or a write operation.

The semiconductor memory device of the disclosure includes: a memory cell array; an error detection and correction circuit, comprising a first error detection and correction function for performing m-bit error detection and correction and a second error detection and correction function for n-bit error detection and correction (m and n are natural numbers, m<n); a setting register for setting selection information for selecting the first error detection and correction function or the second error detection and correction function; and a controller, during a read operation or a write operation, to execute the first error detection and correction function or the second error detection and correction function based on the selection information.

Since the disclosure selects the function between the first error detection and correction function and the second error detection and correction function by, for example, switching between different error detection and correction capabilities based on the product life cycle or the like, the performance of the error detection and correction and the performance of the read or write operation coexist in the disclosure.

DESCRIPTION OF THE EMBODIMENTS

Embodiments of the disclosure are described in detail with reference to the drawings. The semiconductor memory device of the disclosure is, for example, a NAND flash memory, or a microprocessor, microcontroller, logic, application specific integrated circuit (ASIC), processors that process images or sounds, or processors that process wireless signals embedded in such flash memory.

Figure 1:
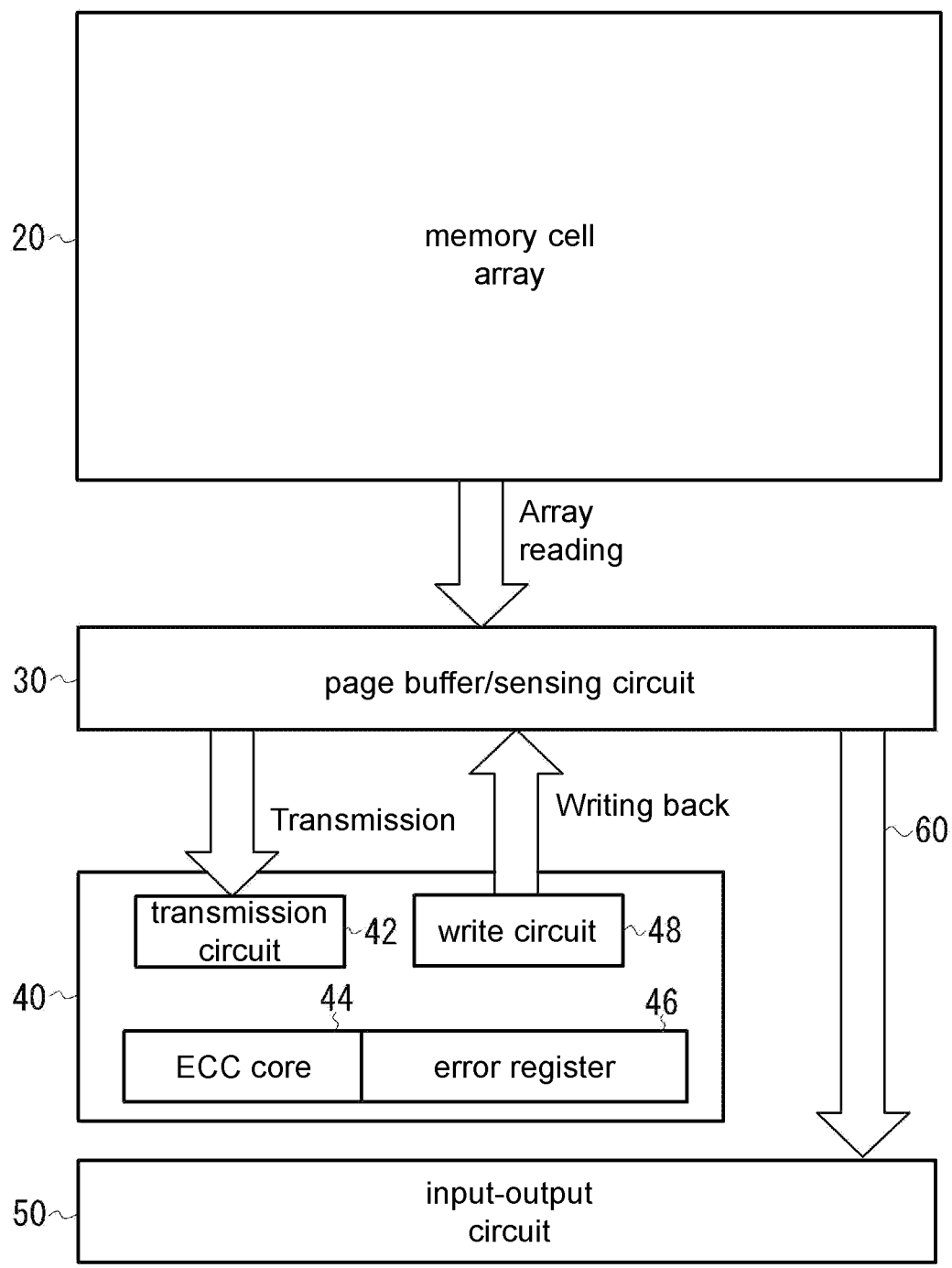
FIG. 1 is a diagram of a schematic configuration of a NAND flash memory that has a conventional on-chip ECC function.
Figure 2:
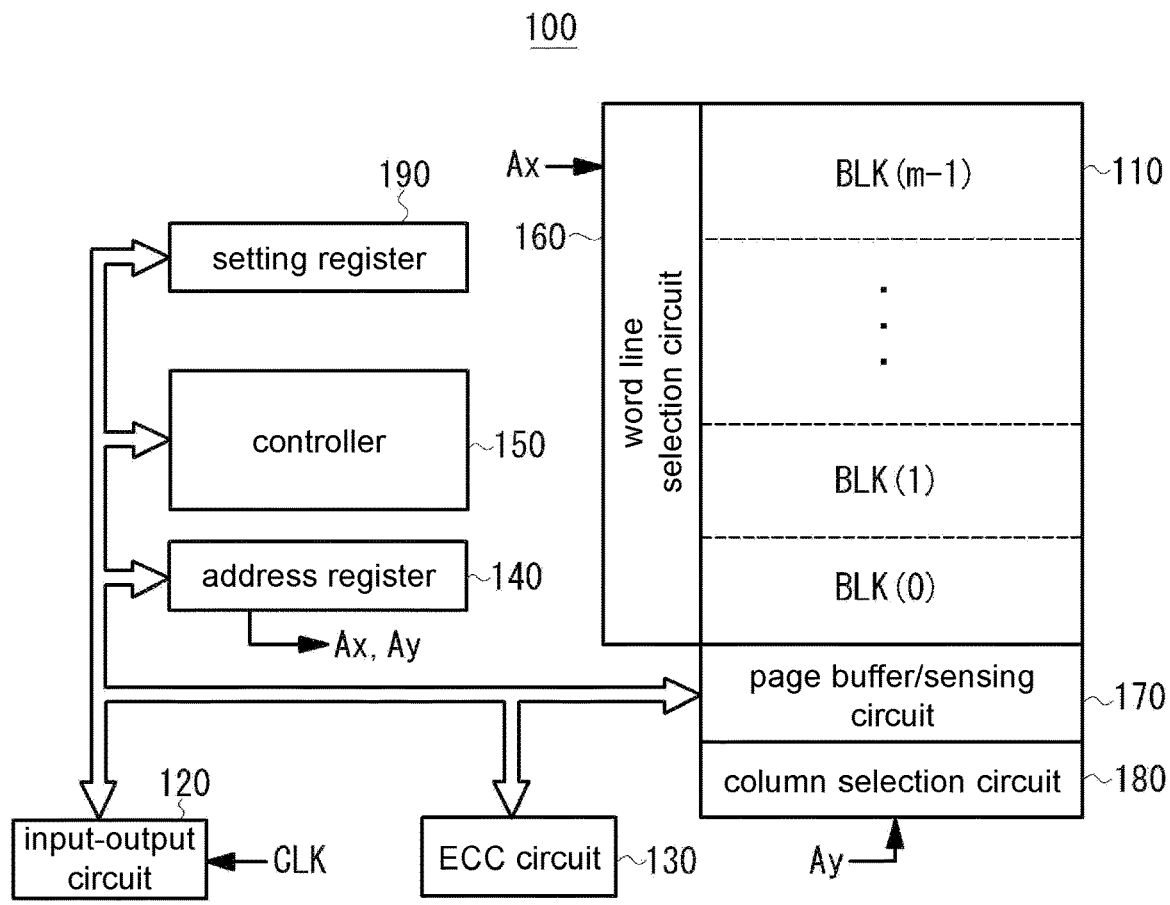
FIG. 2 is a block diagram of the structure of a NAND flash memory according to an embodiment of the disclosure.

FIG. 2 is a diagram of an internal structure of a NAND flash memory according to an embodiment of the disclosure. A flash memory 100 includes: a storage unit array 110, in which a plurality of storage units are disposed in a matrix; an input-output circuit 120, connected to the external input-output terminal to output the read data to the outside or imports the data input from the outside; an ECC circuit 130, adapted to perform generation of error correction codes for data to be programmed or error detection and correction of data read out based on the error correction codes; an address register 140, adapted to receive address data through the input and output circuit 120; a controller 150, adapted to control each part according to a command (instruction) received through the input-output circuit 120 or a control signal applied to the control terminal; a word line selection circuit 160, adapted to perform block selection or word line selection based on the decoding result of row address information Ax from the address register 140; a page buffer/sensing circuit 170, adapted to hold the data read from the selected page of the memory cell array 110, or hold the data to be programmed in the selected page; a column selection circuit 180, adapted to perform column selection based on the decoding result of column address information Ay from the address register 140; and a setting register 190, adapted to set selection information related to a plurality of error detection and correction functions. Although not shown here, the flash memory 100 further includes an internal voltage generating circuit. The internal voltage generating circuit generates voltages (like program voltage Vpgm, pass voltage Vpass, read voltage Vread, and erase voltage Vers) required for reading, programming (writing), and erasing data. In addition, the NAND flash memory 100 may be equipped with an SPI for realizing compatibility of the operations of a NOR flash memory.

The memory cell array 110 has, for example, m memory blocks BLK(0), BLK(1), . . . , BLK(m−1) disposed in the column direction. A plurality of NAND strings are formed in one memory block, and one NAND string includes a plurality of memory cells connected in series, a bit line side selection transistor, and a source line side selection transistor. The drain electrodes of the bit line side selection transistors are connected to a corresponding global bit line, and the source electrodes of the source line side selection transistors are connected to a common source line. The gate of the memory cell is connected to the corresponding word line, and the gates of the bit line side selection transistor and the source line side selection transistor are respectively connected to a selection gate line SGD and a selection gate line SGS. The word line selection circuit 160 drives the bit line side selection transistor and the source line side selection transistor through the selection gate line SGD and the selection gate line SGS based on the row address information Ax to select a block or a word line. NAND strings may be formed on the substrate surface either two-dimensionally or three-dimensionally. In addition, the storage unit may be a single-level cell (SLC) that stores 1 bit (binary data), or may be one that stores multiple bits.

During the read operation, a positive voltage is applied to the bit line, a voltage (e.g., 0 V) is applied to the selected word line, a pass voltage Vpass (e.g., 4.5 V) is applied to the unselected word lines, and a positive voltage (for example, 4.5 V) is applied to the selection gate line SGD and the selection gate line SGS. This turns on the bit line side selection transistor, the source line side selection transistor, and makes the common source line SL at 0 V. In the programming operation, a high-voltage programming voltage Vpgm (for example, 15 V to 20 V) is applied to the selected word line, an intermediate potential (such as 10 V) is applied to the non-selected word lines. This turn on the selection transistor on the bit line side, turns off the selection transistor on the source line side, and supplies the bit line with a potential corresponding to the data "0" or "1". During the erase operation, 0 V is applied to the selected word line in the block, and a high voltage (e.g., 20 V) is applied to the P-well.

Figure 3:
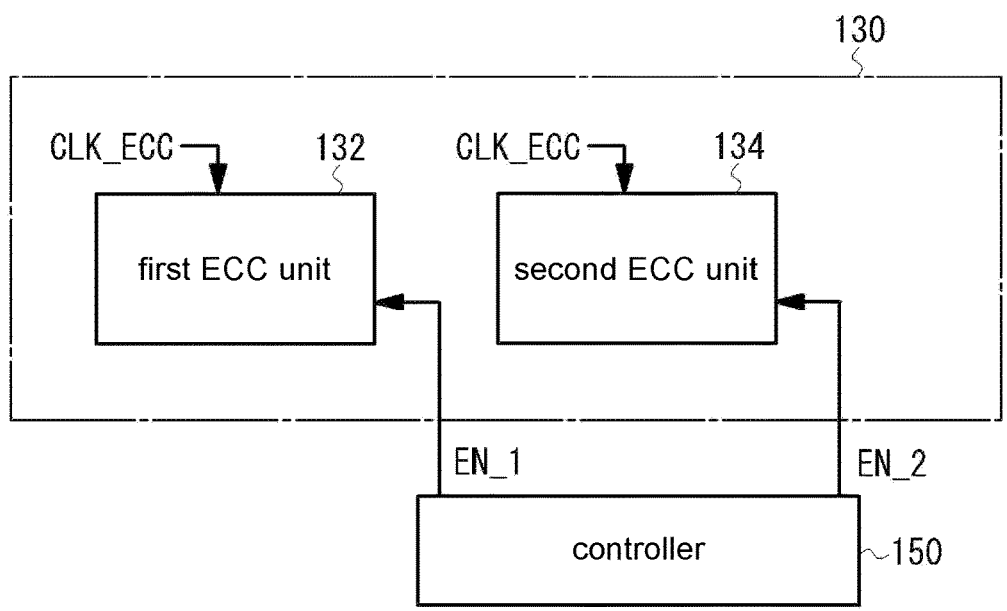
FIG. 3 is a diagram of an internal configuration of an ECC circuit according to an embodiment of the disclosure.

In one configuration, as shown in FIG. 3, an ECC circuit 130 includes a first ECC unit 132 having a 1-bit error detection and correction function, and a second ECC unit 134 having an 8-bit error detection and correction function. The first ECC unit 132 performs data encoding/decoding using the Hamming code, and the second ECC unit 134 performs data encoding/decoding using the BCH (Bose-Chaudhuri-Hocquenghem) codes. The first enable signal EN_1 and the second enable signal EN_2 are respectively supplied from the controller 150 to the first ECC unit 132 and the second ECC unit 134. The first ECC unit 132 is enabled when the first enable signal EN_1 is in the first logic state, and the first ECC unit 132 is disabled when the first enable signal EN_1 is in the second logic state. The second ECC unit 134 is enabled when the second enable signal EN_2 is in the first logic state, and the second ECC unit 134 is disabled when the second enable signal EN_2 is in the second logic state. The first ECC unit 132 and the second ECC unit 134 perform ECC processing in synchronization with the internal clock signal CLK_ECC supplied.

The setting register 190 sets and holds selection information for selecting the operation of the first ECC unit 132 or the second ECC unit 134. Table 1 shows an example of the setting register of the disclosure. The selection information includes, for example, a 1-bit flag as shown in Table 1. The flag "0" specifies the selection of the first ECC unit 132, and the flag "1" specifies the selection of the second ECC unit 134. In one configuration, the selection information is loaded from a fuse read only memory (ROM) (a fuse memory cell) when a power-on sequence of the flash memory 100 is performed. In the default state or when the product is manufactured, the flag "0" is stored in the fuse ROM as the selection information. In the initial or first half of the life cycle, the memory cell has relatively little deterioration over time, so prediction errors occur less frequently. Therefore, the first ECC unit 132 is selected as the initial setting. Therefore, in the first half of the life cycle, the ECC processing time is short, so that the situation where the reading or writing time gets longer due to the ECC processing is subdued.

TABLE 1

| Flag | Specified Content |
| --- | --- |
| 0 | Select the first ECC unit |
| 1 | Select the second ECC unit |

The setting register 190 may be accessed from the outside, and the user can rewrite the selection information set in the setting register 190 by using a predetermined command. After receiving the write command of the setting register from the host computer through the input-output circuit 120 and writing the data, the controller 150 writes the write data to the setting register 190. As a result, the selection information is rewritten. When the life cycle reaches the second half and the memory cell deteriorates over time, the frequency of prediction errors increases accordingly. To cope with this issue, the second ECC unit 134 is selected, switching from the single-bit error detection and correction function to the multi-bit error detection and correction function. As a result, the time for reading or writing becomes longer in the second half of the life cycle due to the ECC process, but the error detection and correction capability also increases, suppressing the decrease in reliability.

The controller 150 includes a microcontroller or a state machine, and controls overall operations of the flash memory 100, such as reading, programming, erasing, and switching between different error detection and correction functions, according to commands or control signals received from outside.

The operation of the ECC circuit 130 is described as follows. During the programming operation, the data input from the I/O circuit 120 is held in the page buffer/sensing circuit 170, and then the held data is transferred to the ECC circuit 130. The ECC circuit 130 performs an ECC operation on the transmitted data, generates error correction codes (e.g., parity check bits), and writes the error correction codes generated back to the spare sector of the page buffer/sensing circuit 170. The input data and error correction codes are programmed to the selected page of the memory cell array 110.

During the read operation, the data read from the selected page of the memory cell array 110 is transferred to the page buffer/sensing circuit 170 and held therein. Next, the stored data is transferred to the ECC circuit 130, and the ECC circuit 130 detects whether there is an error based on the error correction code, and corrects the error of the data when an error is detected. Error correction is performed by, for example, overwriting data held in the page buffer/sensing circuit 170. The data held in the page buffer/sensing circuit 170 is then output to the outside through the input-output circuit 120.

Figure 4:
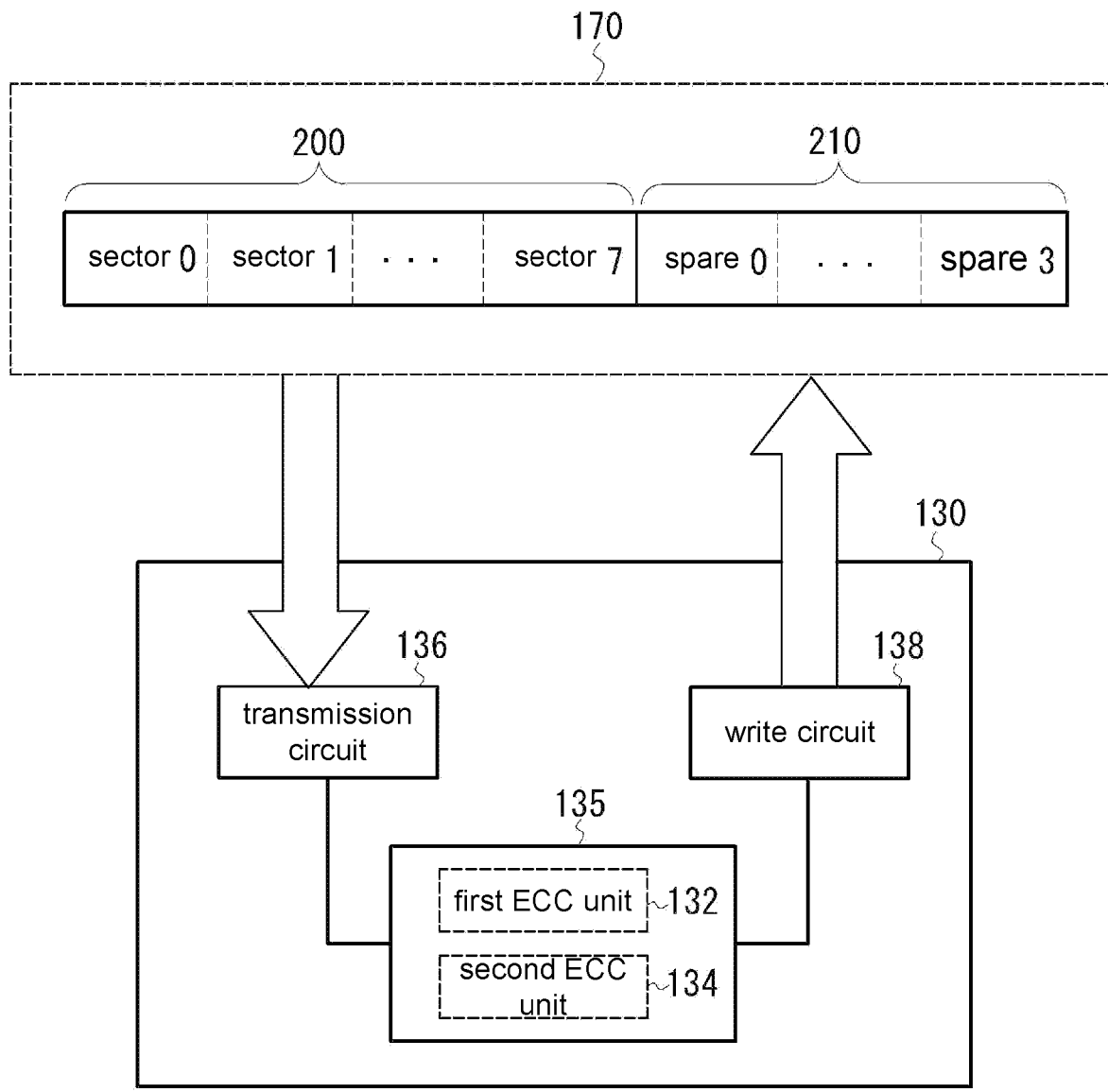
FIG. 4 is a diagram showing the operation of the ECC circuit according to the first embodiment of the disclosure.

An example of the data structure of the page buffer/sensing circuit 170 is shown in FIG. 4. The page buffer/sensing circuit 170 includes, for example, a regular sector 200 divided into eight sectors (namely, sector 0 to sector 7) and a spare sector 210 divided into four sectors (namely, spare 0, spare 1, spare 2, and spare 3). The regular sector is for data storage. For example, one sector of the regular sector 200 contains 256 bytes, and the eight sectors of the regular sector 200 hold data of about 2K bytes as a whole.

One sector of the spare sector 210 includes, for example, 16-byte data, and four sectors (spare 0 to spare 3) hold 64-byte data as a whole. The error correction codes of the sector 0 and the sector 1 of the regular sector 200 are stored in the spare 0. The error correction codes of the sector 2 and the sector 3 of the regular sector 200 are stored in the spare 1. The error correction codes of the sector 4 and the sector 5 of the regular sector 200 are stored in the spare 2. The error correction codes of the sector 6 and the sector 7 of the regular sector 200 are stored in the spare 3.

The ECC circuit 130 includes: a transmission circuit 136, which receives data transmitted in units of sectors and transmits the data to the ECC processing unit 135; the ECC processing unit 135 includes a first ECC unit 132 with a 1-bit error detection and correction function and a second ECC circuit 134 with an 8-bit error detection and correction function; and the write circuit 138 writes the error correction code to the spare sector 210 or writes the corrected data to the regular sector 200.

The controller 150 outputs the enable signal EN_1 and the enable signal EN_2 to the ECC circuit 130 based on the selection information (the flag) set in the setting register 190, such that the first ECC unit 132 or the second ECC unit 134 operates as selected. The first ECC unit 132 uses the Hamming code to perform error detection and correction of a single bit, and the second ECC unit 134 uses the BCH codes to perform 8-bit error detection and correction. The time required for the first ECC unit 132 is shorter than the time required for the second ECC unit 134. Therefore, when the first ECC unit 132 is selected, the time required for reading or writing is shortened compared to when the second ECC unit 134 is selected. In contrast, when the second ECC unit 134 is selected, more error bits may be detected and corrected than when the first ECC unit 132 is selected.

Figure 5:
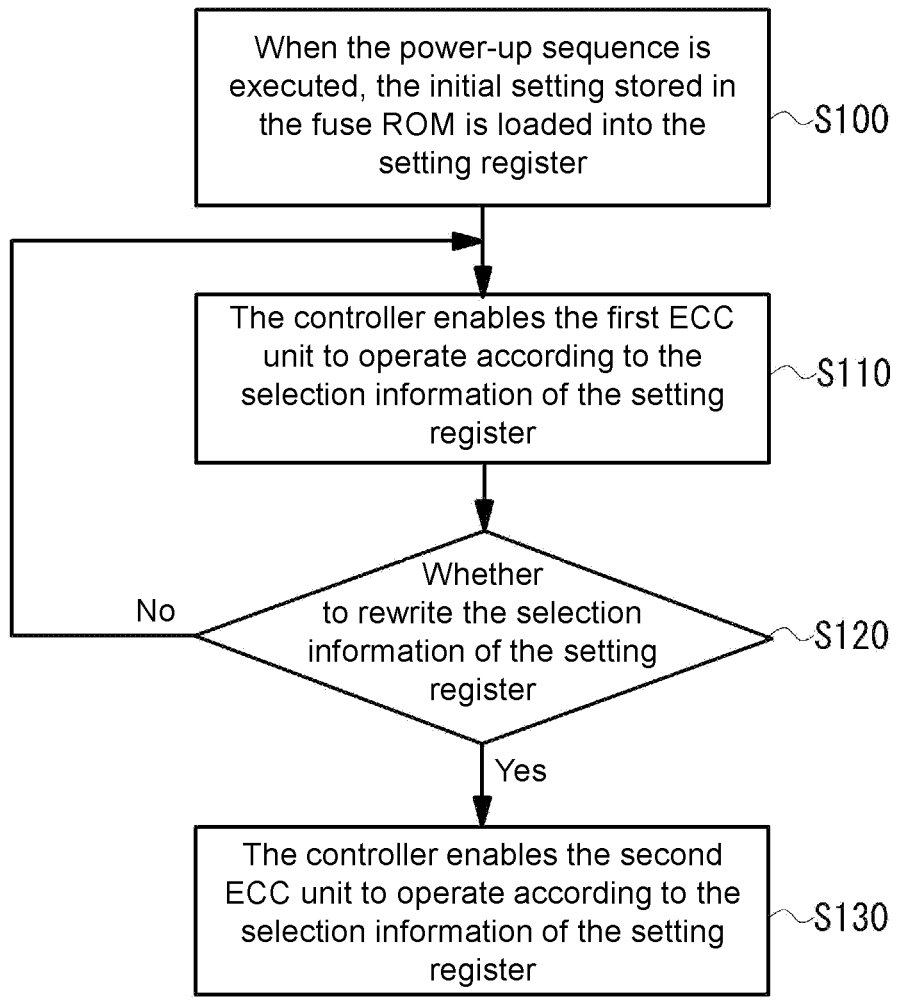
FIG. 5 is a flowchart showing the switching operation of the error detection and correction capabilities of the ECC circuit according to the first embodiment of the disclosure.

FIG. 5 is a flowchart showing the switching operation of the error detection and correction capabilities of the ECC circuit according to the first embodiment of the disclosure. The initial value of the selection information of the first ECC unit 132 or the second ECC unit 134 of the ECC circuit 130 is stored in a fuse ROM (e.g., a user-inaccessible area) different from the user-accessible area of the memory cell array 110. The initial value of the selection information is set to the selection of the first ECC unit 132 as the information when the product is manufactured. When the power-up sequence is executed, the selection information stored in the fuse ROM is loaded into the setting register 190 (S100).

The controller 150 refers to the selection information of the setting register 190 to enable the first ECC unit 132 through the enable signal EN_1 and disable the second ECC unit 134 through the enable signal EN_2. As a result, during the read or write operation, the selected first ECC unit 132 operates, and the second ECC unit 134 does not operate (S110).

Thereafter, the user rewrites the selection information of the setting register 190 according to the usage status of the flash memory and selects the second ECC unit 134 (S120). After the selection information is rewritten, the controller 150 disables the first ECC unit 132 through the enable signal EN_1, and enables the second ECC unit 134 through the enable signal EN_2. As a result, during the read or write operation, the selected second ECC unit 134 operates and the first ECC unit 132 does not operate (S130).

Thus, according to this embodiment, since the first ECC unit 132 or the second ECC unit 134 operates according to the selection information of the setting register, the error detection and correction capability may be selectively switched in accordance with the product life cycle, and the processing time of error detection and correction may be managed optimally, thereby suppressing the decrease in the operation frequency of the page read time or continuous reading. That is, the time required for the ECC processing is shortened and high-speed reading or writing is realized while the memory cell is less deteriorated over time. On the other hand, while the memory cell deteriorates more over time, the error correction capability is enhanced and the reliability is improved.

Although it is from the fuse ROM that the setting register 190 loads the initial value, this is an example to which this embodiment is not necessarily limited to. For example, if the setting register 190 uses part of the memory space of the area of the memory cell array 110 that the user can use, the default value (in the erased state) of the memory space may also indicate the selection of the first ECC unit 132. In this case, the controller 150 reads out the default value of the memory space to enable the first ECC unit 132 and disable the second ECC unit 134. When the second ECC unit 134 is selected, the user programs the default value of the memory space and rewrites the selection information.

The second embodiment of the disclosure is described as follows. In the first embodiment, when the operation is switched from the first ECC unit 132 to the second ECC unit 134, the data encoded by the first ECC unit 132 cannot be decoded by the second ECC unit 134. In other words, the error correction code generated by the first ECC unit 132 stored in the memory cell array 110 cannot be decoded by the second ECC unit 134. Therefore, it is necessary to convert the error correction code generated by the first ECC unit 132 into the error correction code generated by the second ECC unit 134 upon switching to the second ECC unit 134.

Therefore, the copyback function of the flash memory is utilized in the second embodiment, so as to read the pages processed by the first ECC unit 132 from the memory cell array to the page buffer/sensing circuit 170, decode the read data by the first ECC unit 132 (i.e., by performing error detection and correction), and then encode the decoded data again by the second ECC unit 134 to generate an error correction code. And the data including the generated error correction codes are programmed to the original page of the memory cell array.

Such data conversion is performed for all data stored in the first ECC unit 132 of the memory cell array 110. The controller 150 automatically performs data conversion using the copyback function in the background without interfering with the operation of the flash memory 100, or automatically performs data conversion using the copyback function during periods when no operations such as reading or writing are performed. In addition, in a certain configuration, a flag indicating data conversion or non-conversion may be stored in the spare sector, and the controller 150 performs data conversion with reference to the flag and rewrites the flag after the conversion.

In this way, according to the present embodiment, since the data conversion is automatically performed by the copyback function, the switching of the error correction function from the first ECC unit 132 to the second ECC unit 134 is smoothly performed.

The third embodiment of the disclosure is described as follows. In this embodiment, it is based on the address space to switch between different error detection correction capabilities. Table 2 shows a setting example of the setting register 190 in this embodiment. The relationship between the address space and the corresponding flags is preset in the setting register 190. The address space specifies the range of the row addresses of the memory cell array 110. For example, an address space 1 is assigned a flag "0", an address space 2 is assigned a flag "1", and an address space 3 is assigned a flag "0". The flag "0" indicates the selection of the first ECC unit 132. The flag "1" indicates the selection of the second ECC unit 134. Therefore, the first ECC unit 132 is selected when reading or writing to the address space 1, and the second ECC unit 134 is selected when reading or writing to the address space 2.

TABLE 2

| Address | Flag |
|---|---|
| address space 1 | 0 |
| address space 2 | 1 |
| address space 3 | 0 |
| ... | ... |
| address space n | 1 |

Figure 6:
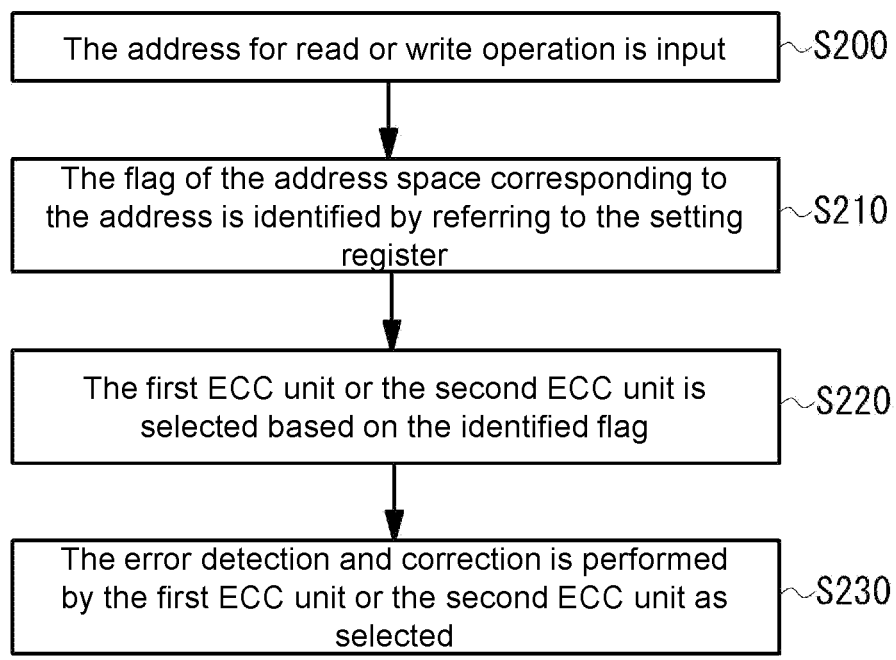
FIG. 6 is a flowchart showing the switching operation of the error detection and correction capability of the ECC circuit according to the third embodiment of the disclosure.

FIG. 6 is a flowchart showing the switching operation of the error detection and correction capabilities of the ECC circuit according to the third embodiment. When performing a read or write operation, a command or an address for reading or writing is input from the outside through the input-output circuit 120 (S200).

The controller 150 refers to the setting register 190 to identify the flag of the address space corresponding to the row address of the input address (S210) and select the first ECC unit 132 or the second ECC unit 134 based on the identified flag (220) to thereby enable the first ECC unit 132 or the second ECC unit 134 through the enable signal EN_1 and the enable signal EN_2. In this way, it is the first ECC unit 132 or the second ECC unit 134 selected according to the address that performs error detection and correction (S230) during the read operation or the write operation.

In this way, the error detection and correction capability may be changed based on the address space in the present embodiment. For example, as in a case where the host computer manages the number of times of data rewriting or erasing of the memory cell array in units of blocks, the address space may also be set in units of blocks, and when the number of times of data rewriting or erasing reaches a certain value or more, the flag of the address space is rewritten from "0" to "1". The error detection and correction capability may be changed according to the degradation of the memory cells over time in the address space.

Figure 7A:
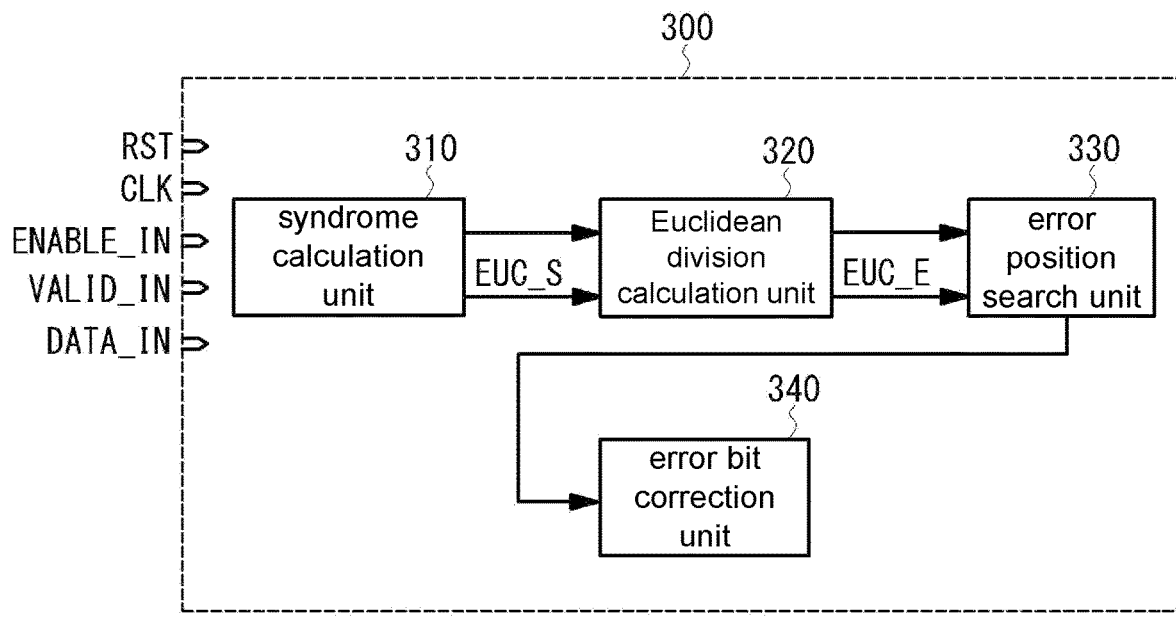
FIG. 7A and FIG. 7B are block diagrams showing the configuration of the decoder of the ECC circuit according to an embodiment of the disclosure.

A specific example of the second ECC unit 134 is described as follows. The second ECC unit 134 includes an encoder that encodes data using BCH codes and a decoder that decodes the BCH-encoded data. FIG. 7A is a block diagram of the internal structure of the BCH decoder. A BCH decoder 300 includes: a syndrome calculation unit 310 of the syndrome for evaluating data, a Euclidean division calculation unit 320 for calculating an error location polynomial (ELP), an error position search unit 330 for calculating the root of the error position polynomial and searching for the error position, and an error bit correction unit 340 for writing the corrected data back to the page buffer/sensing circuit 170 based on the error location found.

The BCH decoder 300 is provided with input terminals for receiving a reset signal RST, a clock signal CLK for ECC operation, an enable signal ENABLE_IN, a valid signal VALID_IN, and data DATA_IN. The syndrome calculation unit 310 outputs a start signal EUC_S indicating the evaluation result and the start of calculation of the Euclidean division to the Euclidean division calculation unit 320. The Euclidean division calculation unit 320 outputs the calculation result of the error position polynomial and an end signal EUC_E indicating the end of the calculation to the error position search unit 330.

Figure 7B:
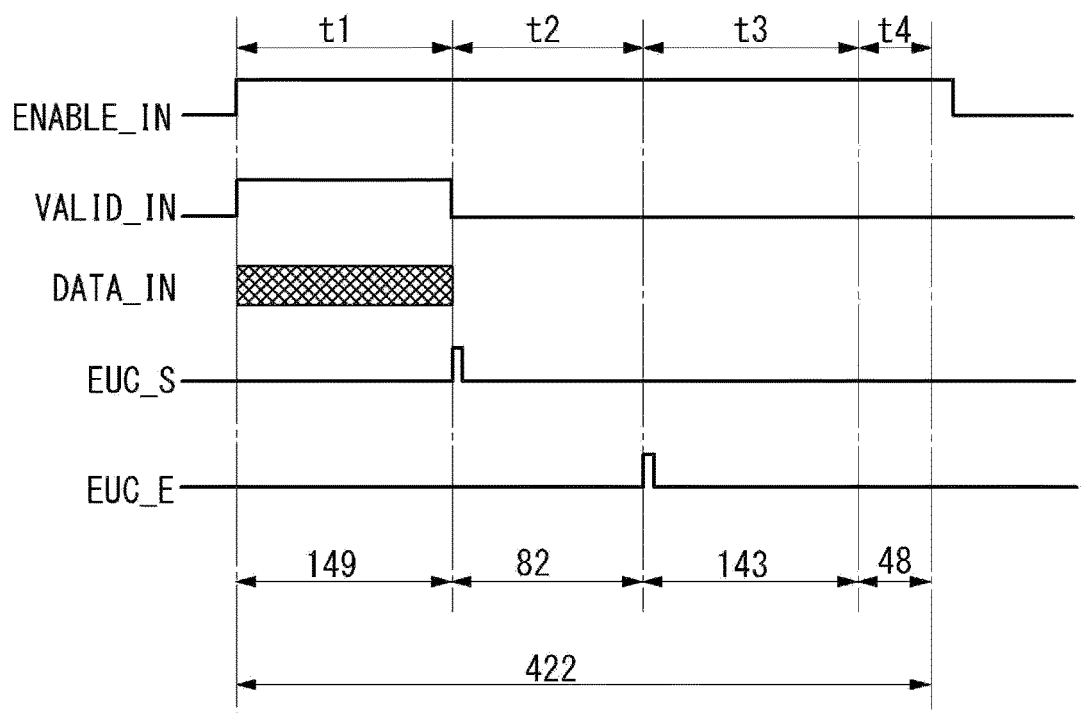

FIG. 7B is a sequence diagram of a processing example of each part of the BCH decoder, in which t1 represents the processing period of the syndrome calculation unit 310, t2 represents the processing period of the Euclidean division calculation unit 320, t3 represents the processing period of the error position search unit 330, and t4 represents the processing period of the error bit correction unit 340.

The BCH decoder 300 performs processing in synchronization with the input clock signal CLK, and operates when the enable signal ENABLE_IN is at the H level. During the period in which the valid signal VALID_IN is at the H level, the data held in the page buffer/sensing circuit is imported from DATA_IN to the syndrome calculation unit 310. When the calculation of the syndrome is completed, the syndrome calculation unit 310 outputs a pulse signal EUC_S indicating the start of the Euclidean division. In response to this, the Euclidean division calculation unit 320 calculates the error position polynomial. When the calculation of the error position polynomial is completed, the Euclidean division calculation unit 320 outputs a pulse signal EUC_E indicating the end of the calculation, and the error position search unit 330 searches for the error position as a response. The error bit correction unit 340 rewrites the data of the page buffer/sensing circuit 170 through the output terminal DATA_OUT.

For example, in the case of 8-bit error detection correction per 528 bits using the BCH codes, the syndrome calculation requires 149 clock cycles, whereas the Euclidean division calculation takes 82 clock cycles, error location search takes 143 clock cycles, and the error correction requires 48 clock cycles. Overall, it takes 422 clock cycles. When the frequency of the clock signal CLK is 50 MHz, one cycle time of the clock is 20 ns, and the decoding process of the BCH codes consumes 8.44 μs. If the size of one page of the page buffer/sensing circuit 170 is 2K bytes, it takes about 34 μs (1688 cycles=422*4).

On the other hand, in the case of performing 1-bit error detection and correction using Hamming code, the number of clock cycles required for error detection and correction of 2K bytes is 330 or so to simplify the structure of syndrome calculation and error correction. If one cycle time of the clock is 20 ns, the processing is completed in about 6.7 μs. It is sufficient to use about ⅙ of the processing time of the 8-bit BCH codes. With a page length of 4K bytes and an array read time of 20 ns, in an 8-bit BCH codes, tRD2=(20 μs+34 μs*2)=88 μs. In contrast, in a 1-bit Hamming code, tRD2=(20 μs+(6.7 μs*2)=34 μs. The difference between the two is apparent. Therefore, using the BCH codes brings impact on the page read time (tRD2) or the upper limit of the clock frequency for the continuous read operation.

The 1-bit error detection and correction function (the first ECC unit 132) and the 8-bit error detection and correction function (the second ECC unit 134) are both provided in the embodiment described above. However, the 8-bit error detection and correction circuit is dominant, and the error bit correction unit 340 may be used repeatedly. Therefore, the ECC circuit 130 may be realized by merely adding a syndrome calculation unit of a 1-bit error detection and correction circuit to an 8-bit error correction function, which does not bring great impact on wafer size.

The error detection corrections using the Hamming code and the BCH codes are exemplified in the embodiments above, but the embodiments serve only as examples. Other codes can also be adopted for the error detection correction in the disclosure.

The 8-bit error detection correction performed by the second ECC unit 134 using the BCH codes is exemplified in the embodiments above, but the embodiments serve only as examples. The BCH codes of the second ECC unit 134 can also perform 2-bit, 4-bit, or 16-bit error detection and corrections. Furthermore, the 1-bit error detection and correction performed by the first ECC unit 132 is exemplified in the embodiments above, but the embodiments serve only as examples. If the relationship is "the error detection and correction function by the first ECC unit 132<the error detection and correction function by the second ECC unit 134", the first ECC unit 132 may also perform error detection and correction of 2 bits or more.

What is claimed is:

1. An error detection and correction method for a semiconductor memory device, the error detection and correction method comprising:

a setting step, setting selection information for selecting a first error detection and correction function to perform m-bit error detection and correction or a second error detection and correction function to perform n-bit error detection and correction, wherein m and n are natural numbers, and m is less than n; and an executing step, performing the first error detection and correction function or the second error detection and correction function based on the selection information during a read operation or a write operation, wherein in the setting step, the selection information is changed externally according to an instruction.

2. The error detection and correction method of claim 1, wherein the selection information specifies a first address space of a memory cell array for selecting the first error detection and correction function and a second address space of the memory cell array for selecting the second error detection and correction function, and the executing step perfoiiiis the first error detection and correction function or the second error detection and correction function based on the first address space or the second address space corresponding to an address of the read operation or the write operation.

3. The error detection and correction method of claim 1, further comprising a converting step, converting first data that is related to the first error detection and correction function and is written to the memory cell array into second data related to the second error detection and correction function when an operation is switched from the first error detection and correction function to the second error detection and correction function.

4. The error detection and correction method of claim 3, wherein in the converting step, the first data in the memory cell array is read to a page buffer/sensing circuit, the first data is thereby converted into the second data through the second error detection and correction function, and the second data is then written to an original position of the memory cell array.

5. The error detection and correction method of claim 1, wherein the Hamming code is adopted for the first error detection and correction function to perform 1-bit error detection and correction, and the Bose—Chaudhuri—Hocquenghem codes are adopted for the second error detection and correction function to perform 2-bit, 4-bit, or 8-bit error detection and correction.

6. The error detection and correction method of claim 1, wherein the memory cell array is a NAND memory cell array comprising a regular sector and a spare sector, and parity check bits generated through the first error detection and correction function or the second error detection and correction function are stored in the spare sector.

7. A semiconductor memory device, comprising:
a memory cell array;
an error detection and correction circuit, comprising a first error detection and correction function for performing m-bit error detection and correction and a second error detection and correction function for performing n-bit error detection and correction, wherein m and n are natural numbers, and m is less than n;

a setting register, adapted to set selection infoiiiiation for selecting the first error detection and correction function or the second error detection and correction function; and a controller, adapted to perform the first error detection and correction function or the second error detection and correction function based on the selection infoimation during a read operation or a write operation, wherein the setting register changes the selection information externally according to an instruction.

8. The semiconductor memory device of claim 7, wherein the selection information specifies a first address space of the memory cell array for selecting the first error detection and correction function and a second address space of the memory cell array for selecting the second error detection and correction function, and the controller performs the first error detection and correction function or the second error detection and correction function based on the first address space or the second address space corresponding to an address of the read operation or the write operation.

9. The semiconductor memory device of claim 7, wherein the controller comprises a converting element, and first data that is related to the first error detection and correction function and is written to the memory cell array is converted into second data related to the second error detection and correction function when the converting element switches an operation from the first error detection and correction function to the second error detection and correction function.

10. The semiconductor memory device of claim 9, wherein the converting element reads the first data in the memory cell array to a page buffer/sensing circuit, the first data is thereby decoded through the first error detection and correction function and encoded through the second error detection and correction function to generate the second data, and the second data is then written to an original position of the memory cell array.

11. The semiconductor memory device of claim 7, wherein the Hamming code is adopted for the first error detection and correction function to perform 1-bit error detection and correction, and the Bose—Chaudhuri—Hocquenghem codes are adopted for the second error detection and correction function to perform 2-bit, 4-bit, or 8-bit error detection and correction.

12. The semiconductor memory device of claim 7, wherein the memory cell array is a NAND memory cell array comprising a regular sector and a spare sector, and parity check bits generated through the first error detection and correction function or the second error detection and correction function are stored in the spare sector.

* * * * *